United States Patent [19]

Johnson

[11] Patent Number: 4,994,408

[45] Date of Patent: Feb. 19, 1991

[54] EPITAXIAL FILM GROWTH USING LOW PRESSURE MOCVD

[75] Inventor: Eric S. Johnson, Scottsdale, Ariz.

[73] Assignee: Motorola Inc., Schaumburg, Ill.

[21] Appl. No.: 306,600

[22] Filed: Feb. 6, 1989

[51] Int. Cl.$^5$ .............................................. H01L 21/20
[52] U.S. Cl. ......................... 437/133; 148/DIG. 56;
148/DIG. 72; 148/DIG. 97; 148/DIG. 110;
437/81; 437/946; 437/976
[58] Field of Search ................... 148/DIG. 56, 65, 72,
148/97, 110, 119, 135, 169; 156/610-614;
422/252, 255.1; 437/81, 105, 107, 126, 133, 939,
946, 974, 976

[56] References Cited

U.S. PATENT DOCUMENTS 3,698,944 10/1972 Dyer ................................... 156/612
4,707,216 11/1987 Morkoc et al. ..................... 156/610

OTHER PUBLICATIONS

Rozeghi et al., "Growth and Characterization of InP Using Metalorganic Chemical Vapor . . . ", J. Crys. Growth, 64 (1983), pp. 76–82.
Tsui et al., "Properties of . . . Grown by Molecular—Beam Epitaxy on Misoriented Substrates", J. Appl. Phys., 59(5), 1 Mar. 1986, pp. 1508–1512.
Mori et al., "Morphology of GaAs Eprtaxial Layers Grown by MOCVD", J. Crys. Growth, 69 (1983), pp. 23–28.
Fukui et al., "(InAs), (GaAs), Layered Crystal Grown by MOCVD", Jpn. J. Appl. Phys., vol. 23, No. 8, Aug. 1984, pp. 2521–2523.
Saxena et al., "Studies of GaAs and AlGaAs Layers Grown by OM-VPE", J. Crys. Growth, 55 (1981), pp. 58–63.
Johnson et al., "Growth of AlGaAs and GaAs by Atmospheric-Pressure MOCVD . . . ", J. Crys. Growth, 85 (1987), pp. 182–187.
Johnson et al., "AlGaAs and GaAs Grown by Atmospheric-Pressure MOCVD on Misoriented Substrates", J. Crys. Growth, 88 (1988), pp. 53–56.

Primary Examiner—Olik Chaudhuri
Assistant Examiner—William D. Bunch
Attorney, Agent, or Firm—Harry A. Wolin

[57] ABSTRACT

A method for growing high quality epitaxial films using low pressure MOCVD that includes providing a substrate that is misoriented from a singular plane, placing the substrate into an MOCVD reactor at a total pressure of less than 0.2 atmospheres and then growing an epitaxial film on the substrate. When providing a misoriented gallium arsenide substrate, the MOCVD reactor is set at a temperature in the range of 650 to 750 degrees centigrade to grow an aluminum gallium arsenide film. This temperature is substantially lower than that at which aluminum gallium arsenide epitaxial films are commonly grown and the resulting film has a smooth surface morphology and enhanced photoluminesence properties.

10 Claims, No Drawings

EPITAXIAL FILM GROWTH USING LOW PRESSURE MOCVD

BACKGROUND OF THE INVENTION

This invention relates, in general, to a method for growing epitaxial films, and more particularly to a method for growing high quality epitaxial films using low pressure metalorganic chemical vapor deposition (MOCVD).

The quality of epitaxial film surface morphology is extremely important in high performance electronic and optoelectronic III-V and II-VI compound devices. Film smoothness influences the quality of submicron lithography and a rough surface morphology at heterointerfaces may degrade electron mobility. Smooth epitaxial film morphology also plays an important role in the operation of optoelectronic devices in such areas as the interfacial recombination velocity, scattering from optical waveguides and the line width of emission from quantum wells.

Epitaxial film morphology is dependent upon various growth parameters such as substrate temperature, substrate orientation, ambient pressure and reagent mole fraction. The growth of epitaxial films on substrates that are critically misoriented from a singular plane is well known in the art. Misorientation effects have been previously observed in liquid phase epitaxy (LPE), chloride-transport vapor phase epitaxy (VPE) and molecular beam epitaxy (MBE). Most recently, atmospheric pressure MOCVD has been used to grow epitaxial films on critically misoriented substrates. The above methods of growing epitaxial films on misoriented substrates have lead those skilled in the art to believe that high quality epitaxial films may be grown on substrates having small (less than 3.0 degrees) misorientations from a singular plane. However, it has been shown by low pressure MOCVD that the growth of epitaxial films on substrates being slightly misoriented from the origin of a singular plane will provide rough, faceted epitaxial films due to long range reordering which lowers step surface energy near a singular plane. Therefore, to build high quality electronic and optoelectronic devices, it is critical that a method of growing high quality epitaxial films be provided.

SUMMARY OF THE INVENTION

Accordingly, it is an object of the present invention to provide a method for growing high quality epitaxial films that uses low pressure MOCVD.

Another object of the present invention is to provide a method for growing high quality epitaxial films that have a superior surface morphology.

It is an additional object of the present invention to provide a method for growing high quality epitaxial films that provides for superior optical properties.

Yet a further object of the present invention is to provide a method for growing high quality epitaxial films that is not dependent on a clean or unflawed substrate.

Another object of the present invention is to provide a method for growing high quality epitaxial films wherein the films may be grown at relatively low temperatures.

A further object of the present invention is to provide a method for growing high quality epitaxial films that employs a lesser quantity of reagents.

The foregoing and other objects and advantages are achieved in the present invention by one embodiment in which, as a part thereof, includes the steps of providing a substrate being misoriented from a singular plane to the critical angle or beyond, placing the substrate into an MOCVD reactor having a total pressure of less than 0.2 atmospheres and growing an epitaxial film layer on the substrate.

A more complete understanding of the present invention can be attained by considering the following detailed description.

DETAILED DESCRIPTION OF THE INVENTION

Disclosed herein is a method for growing high quality epitaxial films using low pressure MOCVD. Initially, a substrate must be provided. Although the specific embodiment discussed herein will employ a gallium arsenide substrate, one skilled in the art will understand that an indium phosphide substrate or other III-V material substrates or II-VI material substrates of a material such as mercury cadmium telluride may be employed. The substrate provided must be misoriented from a singular plane to the critical angle or beyond. One skilled in the art will understand that a singular plane is a plane wherein the step surface energy has a singular point exactly at the low index orientation. One skilled in the art will also understand that the critical angle is the minimum angle at which long-range reordering ceases to produce rough surface morphology. In employing a gallium arsenide substrate, the singular planes are the {100}, {111}A and {111}B crystallographic orientations.

Specific misorientations of gallium arsenide substrates upon which high quality epitaxial films may be grown include a 3.0 to 8.5 degree misorientation from the {100} plane towards the {111}A plane, a misorientation of 4.5 to 12.5 degrees from the {100} plane towards the {111}B plane and a misorientation of at least 4.0 degrees from the {100} plane generally towards the {110} plane. Growing epitaxial films on gallium arsenide substrates having misorientations from the {100} plane less than 3.0 degrees towards the {111}A plane, less than 4.5 degrees towards the {111}B plane and less than 4.0 degrees generally towards the {110} plane will result in epitaxial films having rough surface morphologies. Although misorientations from the {100} plane towards the {111}A, {111}B and {110} planes have been disclosed herein, one skilled in the art will understand that high quality epitaxial films may be grown at misorientations between these planes. These specific misorientations may be determined by extrapolation. Further, misorientations from the {100} plane greater than 8.5 degrees and 12.5 degrees towards the {111}A and {111}B planes, respectively, will cause the growth of epitaxial films having rough surface morphology.

Once a gallium arsenide substrate having the proper misorientation from a singular plane has been provided, it is placed into an MOCVD reactor having a total pressure of less than 0.2 atmospheres with an ideal pressure being 0.04 atmospheres. For optimal film growth, a ratio of Group V to Group III source flows of 30 or less should be employed. In order to grow an aluminum gallium arsenide epitaxial film on the gallium arsenide substrate, the reactor should have a temperature in the range of 650 to 750 degrees centigrade with an ideal temperature of approximately 700 degrees centigrade. One skilled in the art will realize that this temperature is well below the approximately 800 degrees centigrade temperature usually required to grown an aluminum gallium arsenide epitaxial film of high quality. It should be understood that the aluminum gallium arsenide epitaxial film grown herein comprises in the range of 10 to 40 percent aluminum.

An advantage of the present invention is that the misoriented substrate provided need not be totally cleaned or unflawed. It has been shown that the method described herein will result in the growth of high quality epitaxial films even when grown on slightly defected substrates. One skilled in the art will understand that this will greatly increase yield as well as increasing the quality of devices manufactured.

Thus it is apparent that there has been provided, in accordance with the invention, an improved method for growing high quality epitaxial films which meets the objects and advantages set forth above. While specific embodiments of the present invention have been shown and described, further modifications and improvements will occur to those skilled in the art. It is desired that it be understood, therefore, that this invention is not limited to the particular forms shown and it is intended in the appended claims to cover all modifications which do not depart from the spirit and scope of this invention.

What is claimed is:

1. A method for growing high quality epitaxial films using low pressure metalorganic chemical vapor deposition comprising the steps of:

providing a gallium arsenide substrate that is misoriented from the {100} plane one of 3.0 to 8.5 degrees towards the {111}A plane, 4.5 to 12.5 degrees toward the {111}B plane and at least 4.0 degrees generally towards the {110} plane;

placing said substrate into an MOCVD reactor, said reactor having a temperature in the range of 650 to 750 degrees centigrade and a total pressure of less than 0.2 atmospheres; and growing an aluminum gallium arsenide epitaxial film on said substrate.

2. The method of claim 1 wherein the MOCVD reactor has a temperature of approximately 700 degrees centigrade.

3. The method of claim 1 wherein the MOCVD reactor has a Group V to Group III source flow ratio of 30 or less.

4. A method for growing high quality epitaxial films using low pressure metalorganic chemical vapor deposition comprising the steps of:

providing a gallium arsenide substrate that is misoriented from the {100} plane one of 3.0 to 8.5 degrees towards the {111}A plane, 4.5 to 12.5 degrees towards the {111}B plane and at least 4.0 degrees generally towards the {110} plane;

placing said gallium arsenide substrate into an MOCVD reactor, said reactor having a total pressure of less than 0.2 atmospheres and a temperature in the range of 650 to 750 degrees centigrade; and growing an aluminum gallium arsenide film on said gallium arsenide substrate.

5. The method of claim 4 wherein the MOCVD reactor has a temperature of approximately 700 degrees centigrade.

6. The method of claim 4 wherein the MOCVD reactor has a Group V to Group III source flow ratio of 30 or less.

7. A method for growing high quality aluminum gallium arsenide films on gallium arsenide substrates using low pressure metalorganic chemical vapor deposition comprising the steps of:

providing a gallium arsenide substrate, said gallium arsenide substrate being misoriented from the {100} plane one of 3.0 to 8.5 degrees towards the {111}A plane, 4.5 to 12.5 degrees towards the {111}B plane and at least 4.0 degrees generally towards the {110} plane;

placing said gallium arsenide substrate into an MOCVD reactor, said reactor having a total pressure of less than 0.2 atmospheres and a temperature in the range of 650 to 750 degrees centigrade; and growing an aluminum gallium arsenide film on said gallium arsenide substrate.

8. The method of claim 7 wherein the MOCVD reactor has a temperature of approximately 700 degrees centigrade.

9. The method of claim 7 wherein the providing a substrate step includes providing a substrate that is misoriented from the {100} plane towards planes between the {111}A, {111}B and {110} planes.

10. The method of claim 7 wherein the MOCVD reactor has a Group V to Group III source flow ratio of 30 or less.

* * * * *